United States Patent
Wadhwa et al.

(10) Patent No.: US 7,132,863 B2
(45) Date of Patent: Nov. 7, 2006

(54) DIGITAL CLOCK FREQUENCY DOUBLER

(75) Inventors: Sanjay K. Wadhwa, Saharanpur (IN); Qadeer A. Khan, New Delhi (IN); Kulbhushan Misri, Haryana (IN); Deeya Muhury, Jharkhand (IN)

(73) Assignee: Freescale Semiconductor, Inc., Austin, TX (US)

( * ) Notice: Subject to any disclaimer, the term of this patent is extended or adjusted under 35 U.S.C. 154(b) by 31 days.

(21) Appl. No.: 11/098,107

(22) Filed: Apr. 4, 2005

(65) Prior Publication Data

US 2006/0220708 A1    Oct. 5, 2006

(51) Int. Cl.
    *H03B 19/00* (2006.01)
(52) U.S. Cl. .................................... 327/116; 327/122
(58) Field of Classification Search ................ None
    See application file for complete search history.

(56) References Cited

U.S. PATENT DOCUMENTS

| 4,596,954 | A |   | 6/1986  | Haque           |         |
|-----------|---|---|---------|-----------------|---------|
| 4,967,160 | A | * | 10/1990 | Quievy et al.   | 327/116 |
| 5,111,066 | A |   | 5/1992  | Artieri et al.  |         |
| 5,297,179 | A |   | 3/1994  | Tatsumi         |         |
| 5,365,181 | A |   | 11/1994 | Mair            |         |
| 5,530,387 | A |   | 6/1996  | Kim             |         |
| 5,537,068 | A | * | 7/1996  | Konno           | 327/115 |
| 6,046,594 | A |   | 4/2000  | Mauretic        |         |
| 6,259,283 | B1|   | 7/2001  | Nguyen          |         |
| 6,337,588 | B1| * | 1/2002  | Chen            | 327/122 |
| 6,351,756 | B1|   | 2/2002  | Taniyoshi       |         |
| 6,876,236 | B1| * | 4/2005  | Aman            | 327/121 |

\* cited by examiner

*Primary Examiner*—Timothy P. Callahan
*Assistant Examiner*—An T. Luu
(74) *Attorney, Agent, or Firm*—Charles Bergere

(57) ABSTRACT

A digital clock frequency doubler for increasing an input frequency of an input clock signal includes an input block, and a generator block. The input block receives the input clock signal, and generates a pulse signal having an ON period equal to the input clock signal period. The generator block is coupled to the input block. The generator block receives the pulse signal and divides a period of the pulse signal by a period of a high frequency digital signal and then generates an output clock signal with an output frequency that is about two times the input frequency.

12 Claims, 4 Drawing Sheets

DIGITAL CLOCK FREQUENCY DOUBLER

BACKGROUND OF THE INVENTION

The present invention relates generally to a frequency generator for generating a digital signal and, in particular, to a digital clock frequency doubler that doubles the frequency of a digital clock signal.

Clock frequency doublers are widely used in integrated circuits. Several applications make use of phase locked loops (PLLs) to double the frequency of an input clock. However, PLLs require a high design effort and time for implementation. Further, they consume large silicon area and may require external components for usage, resulting in an increased cost.

Other clock frequency doubler designs require an input clock with exactly 50% duty cycle, which is difficult to attain in a chip. Further, they are implemented with analog circuits and are not suitable for input clocks having low frequencies. Designs with analog implementations require large silicon area.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

The present invention provides a digital clock frequency doubler for increasing an input frequency of an input clock signal. The digital clock frequency doubler includes an input block and a generator block. The input block receives the input clock signal and generates a pulse signal having an ON period equal to the input clock signal period. The generator block is coupled to the input block and receives the pulse signal. The generator block divides a period of the pulse signal by a period of a high frequency digital signal for generating an output clock signal. The output clock signal has an output frequency that is about two times the input frequency for increasing an input frequency of an input clock signal.

In another embodiment of the present invention, the digital clock frequency doubler alters the duty cycle of the input clock signal. Therefore, it can be used to change the duty cycle of an input clock signal to a desired value.

In another embodiment of the present invention, a method for doubling an input frequency of an input clock signal is provided. The method includes generating a high frequency digital signal, counting the number of pulses of the high frequency digital signal in a clock cycle of the input clock signal and latching the number of pulses of the high frequency digital signal at predetermined intervals in the clock cycle of the input clock signal. The width of the predetermined intervals is based on doubling the frequency of the input clock signal. An edge is generated for each predetermined interval and the generated edges are combined to generate an output clock signal having two times the frequency of the input clock signal.

The digital clock frequency doubler may be implemented in the form of an integrated circuit or part of an integrated circuit. The implementation does not require external components. Further, a small silicon area is required for the implementation. The digital clock frequency doubler is suitable for applications where doubling of clock frequency is required without expending a large effort and time. An input clock signal of any duty cycle can be used to obtain an output with about fifty (50) percent duty cycle. In other words, the output is independent of the duty cycle of the input clock signal. Also, the output has a determined phase relationship with the input clock signal.

Figure 1:
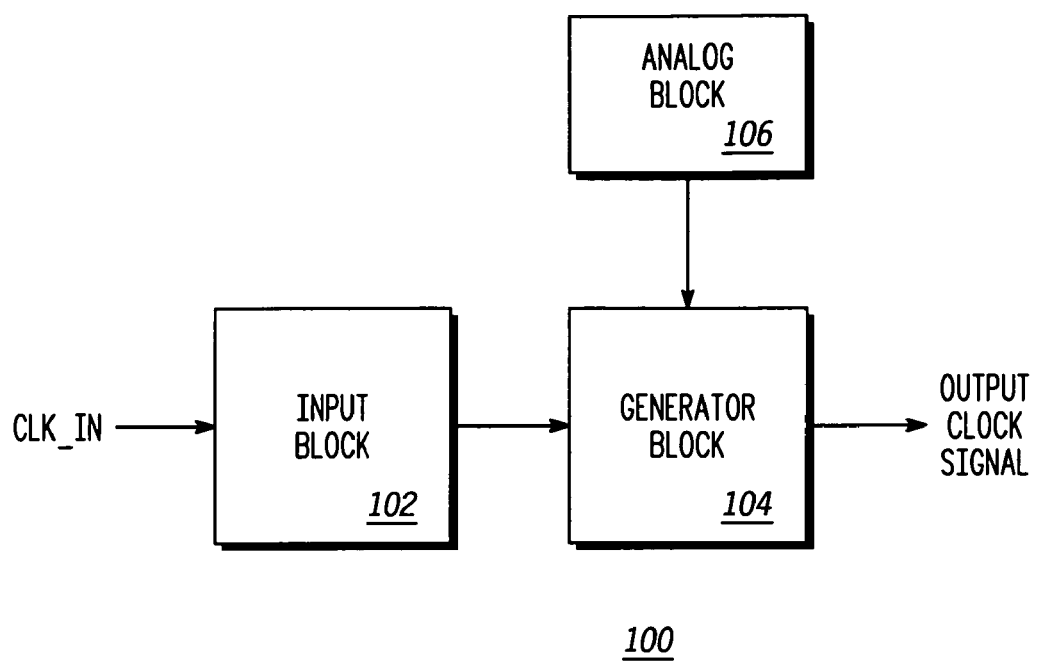
FIG. 1 is a block diagram of a digital clock frequency doubler in accordance with an embodiment of the present invention.

Referring now to FIG. 1, a block diagram of a digital clock frequency doubler 100 in accordance with an exemplary embodiment of the present invention is shown. The digital clock frequency doubler 100 includes an input block 102 and a generator block 104. An input clock signal 'clk_in' with a time period T is input to the input block 102. The input block 102 generates a pulse signal with an ON time T. The generator block 104 divides T by a period ($T_{ro}$) of a high frequency digital signal to generate an output clock signal. The high frequency digital signal is generated by an analog block 106 and input to the generator block 104 from the analog block 106.

Figure 2:
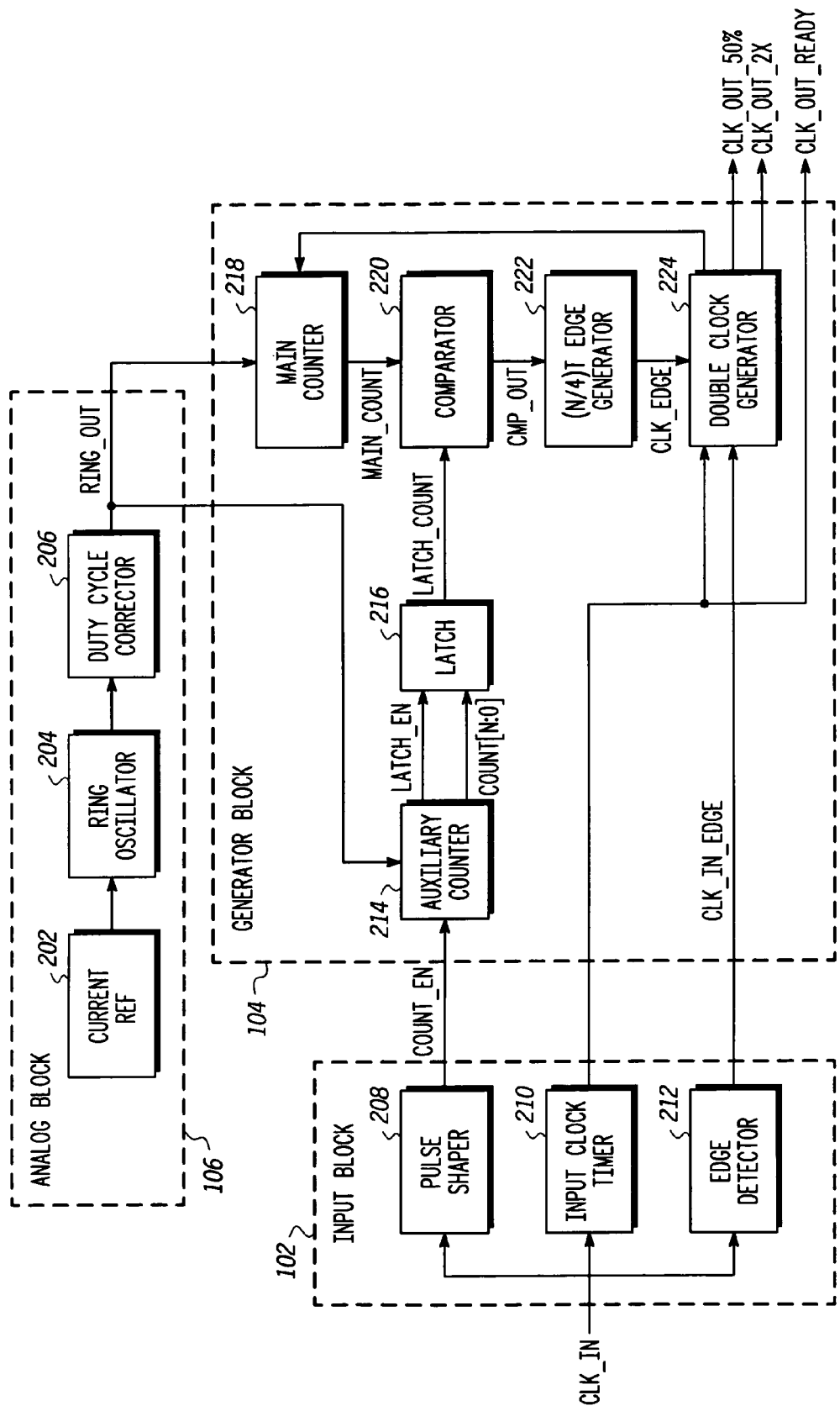
FIG. 2 is a detailed block diagram of a digital clock frequency doubler in accordance with an embodiment of the present invention.

FIG. 2 is a detailed block diagram of the digital clock frequency doubler 100 in accordance with an embodiment of the present invention. In this embodiment, the analog block 106 includes a current reference circuit 202, a ring oscillator 204, and a duty cycle corrector 206. The current reference circuit 202 generates a signal with a stable current that is provided as an input to the ring oscillator 204. The ring oscillator 204 generates the high frequency digital signal with time period $T_{ro}$. In one embodiment of the invention, the ring oscillator 204 comprises a current controlled oscillator (CCO) having three inverter stages. A CCO is used because it has good power supply rejection as compared to a normal ring oscillator. In an embodiment of the present invention, the frequency of the high frequency digital signal is greater than a predetermined threshold. The predetermined threshold is based on jitter in the output clock signal. In general, the higher the frequency of the high frequency digital signal, the less the output clock signal will jitter. In one embodiment of the present invention, the frequency of the high frequency digital signal is about one gigahertz. The high frequency digital signal may not have a fifty (50) percent duty cycle. Further, its output voltage swing may not be rail-to-rail. The duty cycle corrector 206 adjusts the duty cycle of the high frequency digital signal to approximately 50 percent (+/− about 5%) and makes the output voltage swing rail-to-rail. The modified high frequency digital signal 'ring_out' is then input to the generator block 104. Although, the ring oscillator 204 is used for generating the high frequency digital signal in this embodiment, other sources such as, but not limited to, an LC oscillator and a phase locked loop (PLL) can be used as per the availability on the chip for generating the high frequency digital signal.

The input block 102 includes a pulse shaper 208, an input clock timer 210, and an edge detector 212, which receive the input clock signal. The pulse shaper 208 generates a pulse signal 'count_en' which has an ON time T, which is a period equal to the input clock period after every eight (8) cycles of the input clock clk_in. The pulse signal count_en is provided as an input to the generator block 104. The pulse signal count_en is repeated after a predetermined number of clock cycles of clk_in (e.g., eight (8)). The edge detector 212 generates an edge at each rising edge of the input clock signal clk_in. The input clock timer 210 sequences the operation of the generator block 104.

The generator block 104 includes an auxiliary counter 214, a latch 216, a main counter 218, a comparator 220, an NT/4 edge generator 222, and a double clock generator 224. The ring_out signal is provided to the auxiliary counter 214 and the main counter 218. The auxiliary counter 214 counts the number of cycles of ring_out in one pulse of count_en, i.e., the number of cycles of ring_out in time T is counted by the auxiliary counter 214. In other words, the auxiliary counter 214 measures T in terms of $T_{ro}$. On counting the number of cycles of ring_out in time T, the auxiliary counter 214 enables the latch 216 with a signal latch_en. The latch 216 then stores the count ($N_c$) generated by the auxiliary counter 214. In particular, values equal to $N_c/4$, $N_c/2$, and $3N_c/4$ are stored by the latch 216. $N_c$ is updated after every predetermined number of clock cycles of clk_in. The predetermined number is based on process, voltage, and temperature (PVT) variations, i.e., the count is updated for the changes that may occur in the ring_out frequency due to PVT variations. Further, if there is a frequent variation in PVT, then the count_en pulse is set to repeat itself frequently. However, if the PVT variations are not frequent, then the count_en pulse is set to repeat itself less frequently. In an exemplary embodiment of the present invention, the predetermined number of clock cycles of clk_in after which the count_en pulse repeats itself is eight (8). It will be apparent to one skilled in the art that the predetermined number of clock cycles can be more or less than eight depending on the PVT variations.

The main counter 218 also counts the number of clock cycles of ring_out. The comparator 220 compares the counted cycles from the main counter 218 with the values stored in the latch 216. The comparator generates a signal cmp_out, which is provided to the NT/4 edge generator 222. When the number of counted cycles from the main counter 218 is equal to a predetermined value stored in the latch 216, the NT/4 edge generator 222 generates a count signal. According to one embodiment of the invention, the comparator 220 generates a count signal each time the number of counted cycles from the main counter 218 is equal to $N_c/4$. In other words, count signals are generated periodically at intervals of T/4, i.e., edges are generated when the number of counted cycles from the main counter 218 equals $N_c/4$, $N_c/2$, and $3N_c/4$, which are the values stored in the latch 216. The generated edges 'clk_edge' are received by the double clock generator 224. On receiving the edge corresponding to $3N_c/4$, the double clock generator 224 sends a signal 'clk_out_¾' to reset the main counter 218. The main counter 218 will be set again at a next rising edge of clk_in, and again edges are generated for $N_c/4$, $N_c/2$, and $3N_c/4$. The double clock generator 224 combines the edges corresponding to $N_c/4$, $N_c/2$, and $3N_c/4$ to generate the output clock signal 'clk_out_2x'. This process is repeated every clock cycle of input clock clk_in for generating the output clock signal. In one embodiment of the invention, the auxiliary counter 214 and the main counter 218 are realized using a pre-scalar technique to run at high frequency. The pre-scalar stage has a two (2) bit length and the second stage has a six (6) bit length and runs at ring_out/4 frequency.

The double clock generator 224 is triggered by an output of the input clock timer 210. The input clock timer 210 generates clk_out_ready signal after a predetermined number of input clock cycles, which takes into account the startup time of current reference 202 and the duty cycle corrector 206.

A clk_in_edge signal generated by the edge detector 212 synchronizes the double clock generator 224 with clk_in by generating an edge at each rising edge of clk_in. On receiving the clk_in_edge signal, the clk_out_¾ signal is deactivated and the main counter 218 comes out of reset. At each rising edge of the signal clk_in_edge, the output clock signal clk_out_2x is activated. Since, $N_c/4$ corresponds to T/4, and $3N_c/4$ corresponds to 3 T/4, the period of clk_out_2x is given by $$T_{clk\_out\_2x} = 3T/4 - T/4 = T/2 \quad (1)$$

i.e., the period of clk_out_2x is half the period of clk_in, or in other words, the clk_out_2x frequency is twice the clk_in frequency. Further, clk_out_2x has a fifty (50) percent duty cycle as the edges are generated at equal intervals.

In an embodiment of the present invention, the digital clock frequency doubler 100 alters the duty cycle of clk_in. This is achieved by storing count values corresponding to a desired duty cycle. Edges corresponding to the count values are then generated. These edges are combined to generate an output clock with the desired duty cycle. For example, for generating an output clock with fifty (50) percent duty cycle 'clk_out_50%', an edge is generated after every $N_c/2$ count value.

The double clock generator 224 generates the output clock signals clk_out_2x and clk_out_50% when clk_out_ready goes ON. The output clock signals continue to occur for the ON time of clk_out_ready.

Figure 3:
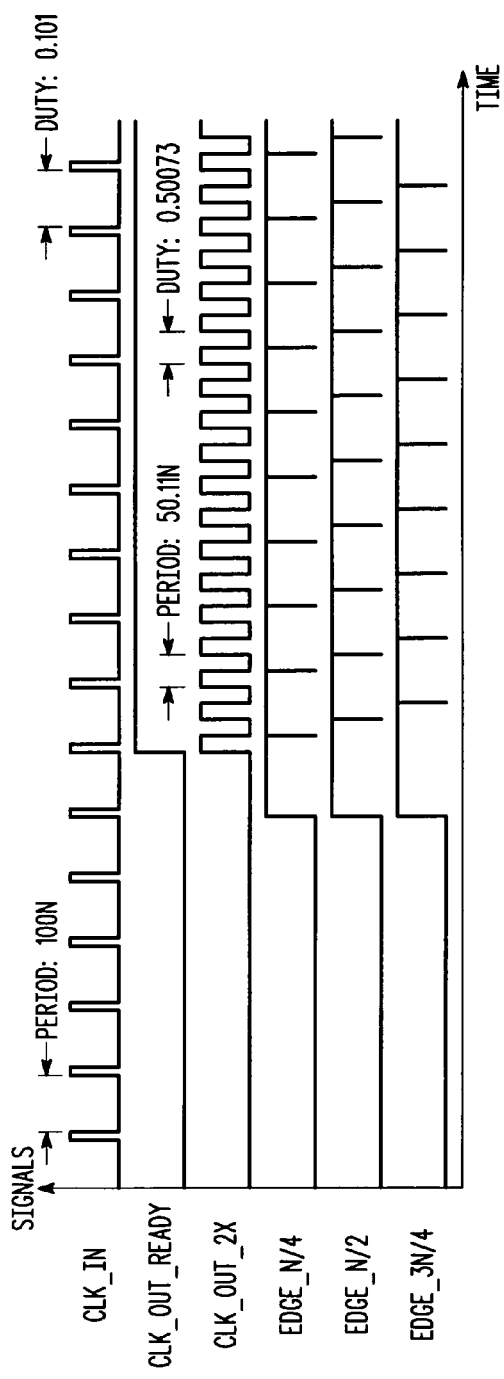
FIG. 3 is a waveform diagram illustrating timing behavior of an output clock signal in accordance with the embodiment of the present invention shown in FIG. 2.

FIG. 3 is a waveform diagram illustrating the timing behavior of clk_out_2x in accordance with an embodiment of the present invention. In FIG. 3, clk_in has a period T=100 ns and a duty cycle of ten (10) percent. Clk_out_2x is generated by combining the edges at $N_c/4$, $N_c/2$, and $3N_c/4$ depicted by waveforms edge_$N_c/4$, edge_$N_c/2$, and edge_$3N_c/4$ respectively. Clk_out_2x has about two times the frequency of clk_in and a duty cycle of approximately fifty (50) percent.

Figure 4:
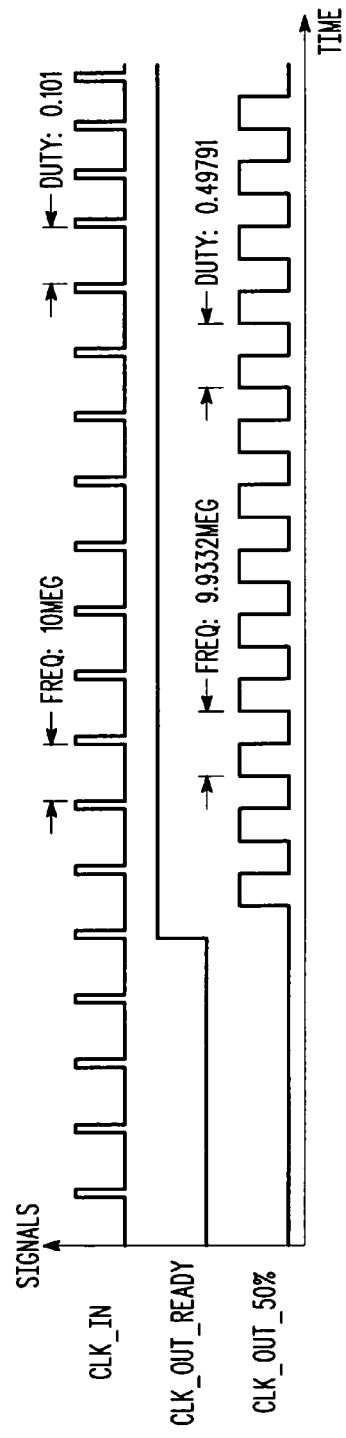
FIG. 4 is a waveform diagram illustrating duty cycle alteration of an input clock signal in accordance with the embodiment of the present invention shown in FIG. 2.

FIG. 4 is a waveform diagram illustrating the duty cycle alteration of clk_in in accordance with an embodiment of the present invention. In FIG. 4, the frequency of clk_out_50% is the same as clk_in, which is about 10 MHz. However, the duty cycle of clk_out_50% is about fifty (50) percent, or 0.5 MHz.

Figure 5:
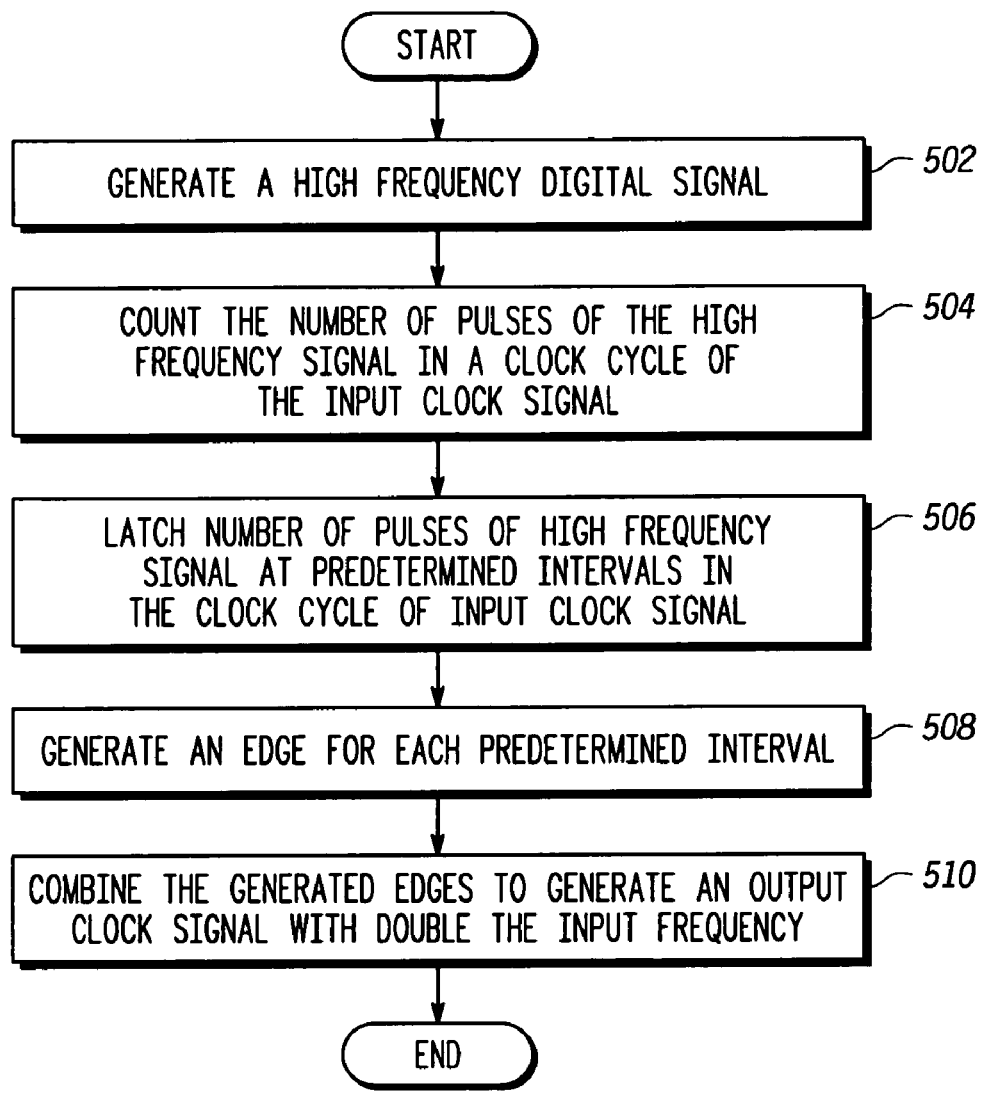
FIG. 5 is a flowchart depicting a method for doubling frequency of an input clock signal in accordance with the present invention.

FIG. 5 is a flowchart depicting a method for doubling the clk_in frequency, in accordance with the present invention. In this method, the high frequency digital signal ring_out is generated at step 502. The number of pulses of ring_out is counted in a clock cycle of clk_in at step 504. The counted pulses corresponding to predetermined intervals of clk_in (i.e., T/4, T/2, and 3 T/4) are latched at step 506. An edge for each predetermined interval is generated at step 508. The generated edges are then combined to generate the output clock signal clk_out_2x, whose frequency is twice the frequency of clk_in.

Although, the method described above is used for doubling the frequency of the digital clock frequency doubler 100, it can be extended to scale up the frequency of an input clock by a predetermined factor. For example, the frequency of an input clock can be tripled. In such a case, the counted pulses of ring_out can correspond to intervals T/6, T/3, T/2, 2 T/3 and 5 T/6. The counted pulses can be latched, and edges can be generated for these intervals. The generated edges can then be combined to generate an output clock signal with triple the frequency of clk_in.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claimed is:

1. A digital clock frequency doubler for increasing an input frequency of an input clock signal, the digital clock frequency doubler comprising:
   an input block that receives the input clock signal and generates a pulse signal having an ON period equal to the input clock signal period; and
   a generator block coupled to the input block and receiving said pulse signal and dividing a period of said pulse signal by a period of a high frequency digital signal for generating an output clock signal, wherein the output clock signal has an output frequency that is about two times the input frequency, wherein the input block comprises:
      a pulse shaper that receives the input clock signal and generates the pulse signal;
      an edge detector for generating an edge at each rising edge of the input clock signal; and
      an input clock timer that receives the input clock signal and sequences the operation of the generator block.

2. The digital clock frequency doubler of claim 1, wherein the digital clock frequency doubler alters the duty cycle of the input clock signal.

3. The digital clock frequency doubler of claim 1, wherein the generator block comprises:
   an auxiliary counter that receives the high frequency digital signal and counts the cycles ($N_c$) thereof in one period of the pulse signal;
   a latch that stores the count $N_c$;
   a main counter that receives the high frequency digital signal and counts the cycles thereof;
   a comparator that compares said counted cycles from the main counter with predetermined ones of corresponding count values stored in the latch;
   a NT/4 edge generator coupled to the comparator for generating a count signal when said predetermined main counter count values are equal to said predetermined ones of corresponding count values stored in the latch; and
   a double clock generator coupled to the NT/4 edge generator for receiving the count signal and generating the output clock signal therefrom.

4. The digital clock frequency doubler of claim 3, wherein a predetermined number of clock cycles of the input clock signal is based on process, voltage and temperature (PVT) variations.

5. The digital clock frequency doubler of claim 3, wherein the latch stores values equal to $N_c/4$, $N_c/2$ and $3N_c/4$.

6. The digital clock frequency doubler of claim 5, wherein the double clock generator combines the latched values of $N_c/4$, $N_c/2$ and $3N_c/4$ to generate the output clock signal.

7. The digital clock frequency doubler of claim 3, wherein the double clock generator is triggered by an output of the input clock timer.

8. The digital clock frequency doubler of claim 7, wherein the double clock generator is synchronized with the input clock signal via the edge detector.

9. The digital clock frequency doubler of claim 1, wherein the frequency of the high frequency digital signal is based on a predetermined threshold.

10. A digital clock frequency doubler for increasing an input frequency of an input clock signal, the digital clock, frequency doubler comprising:
   an input block that receives the input clock signal and generates a pulse signal having an ON period equal to the input clock signal period, wherein the input block includes:
      a pulse shaper that receives the input clock signal and generates the pulse signal;
      an edge detector for generating an edge at each rising edge of the input clock signal; and
      an input clock timer that receives the input clock signal and sequences the operation of the generator block; and
   a generator block coupled to the input block and receiving said pulse signal and dividing a period of said pulse signal by a period of a high frequency digital signal for generating an output clock signal, wherein the output clock signal has an output frequency that is about two times the input frequency, wherein the generator block includes:
      an auxiliary counter that receives the high frequency digital signal and counts the cycles ($N_c$) thereof in one period of the pulse signal and divides said number of cylces by the period of the pulse signal to generate $N_c$;
      a latch that stores the count $N_c$;
      a main counter that receives the high frequency digital signal and counts the cycles thereof;
      a comparator that compares said counted cycles from the main counter with predetermined ones of corresponding count values stored in the latch;
      a NT/4 edge generator coupled to the comparator for generating a count signal when said predetermined main counter count values are equal to said predetermined ones of corresponding count values stored in the latch; and
      a double clock generator coupled to the NT/4 edge generator for receiving the count signal and generating the output clock signal therefrom.

11. A method for doubling an input frequency of an input clock signal, the method comprising:
   generating a high frequency digital signal;
   counting the number of pulses of the high frequency digital signal in a clock cycle of the input clock signal;
   latching the number of pulses of the high frequency digital signal at predetermined intervals in the clock cycle of the input clock signal, wherein the width of the predetermined intervals is based on doubling the input frequency;
   generating an edge for each predetermined interval; and
   combining the generated edges to generate an output clock signal having double the frequency of the input clock signal.

12. The method for doubling an input frequency of an input clock signal of claim 11, wherein the time period of a predetermined interval is one-fourth the clock cycle of the input clock signal.

* * * * *

UNITED STATES PATENT AND TRADEMARK OFFICE
CERTIFICATE OF CORRECTION

PATENT NO. : 7,132,863 B2  Page 1 of 1
APPLICATION NO. : 11/098107
DATED : April 4, 2005
INVENTOR(S) : Sanjay Kumar Wadhwa It is certified that error appears in the above-identified patent and that said Letters Patent is hereby corrected as shown below:

In Column 5, Line 61, Claim No. 5:
    Change "$N_c/2$and" to --$N_c/2$ and--

In Column 5, Line 64, Claim No. 6:
    Change "$N_c/2$and" to --$N_c/2$ and--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,132,863 B2 | Page 1 of 1 |
| APPLICATION NO. | : 11/098107 | |
| DATED | : November 7, 2006 | |
| INVENTOR(S) | : Sanjay Kumar Wadhwa | |

It is certified that error appears in the above-identified patent and that said Letters Patent is hereby corrected as shown below:

In Column 5, Line 61, Claim No. 5:
    Change "$N_c/2$and" to --$N_c/2$ and--

In Column 5, Line 64, Claim No. 6:
    Change "$N_c/2$and" to --$N_c/2$ and--

This certificate supersedes the Certificate of Correction issued May 13, 2008.

Signed and Sealed this

Third Day of June, 2008

JON W. DUDAS
*Director of the United States Patent and Trademark Office*